United States Patent
Barbier et al.

(10) Patent No.: US 8,853,755 B2
(45) Date of Patent: Oct. 7, 2014

(54) IMAGE SENSOR PIXEL CIRCUIT

(75) Inventors: Frédéric Barbier, Grenoble (FR); François Roy, Seyssins (FR)

(73) Assignees: STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 556 days.

(21) Appl. No.: 12/889,537

(22) Filed: Sep. 24, 2010

(65) Prior Publication Data

US 2011/0068381 A1  Mar. 24, 2011

(30) Foreign Application Priority Data

Sep. 24, 2009  (FR) ...................................... 09 56600

(51) Int. Cl.
| | |
|---|---|
| *H01L 31/113* | (2006.01) |
| *H04N 5/365* | (2011.01) |
| *H01L 27/146* | (2006.01) |
| *H04N 5/378* | (2011.01) |
| *H04N 5/3745* | (2011.01) |

(52) U.S. Cl.
CPC ............... *H04N 5/378* (2013.01); *H04N 5/365* (2013.01); *H01L 27/14683* (2013.01); *H01L 27/14609* (2013.01); *H04N 5/3745* (2013.01); *H01L 27/1463* (2013.01)
USPC .................................. 257/292; 257/E27.132

(58) Field of Classification Search
CPC ..................... H01L 27/14609; H01L 27/1463; H01L 27/14616
USPC ................ 257/292, E27.13–E27.132; 438/59
See application file for complete search history.

(56) References Cited

U.S. PATENT DOCUMENTS

| | | | |
|---|---|---|---|
| 6,127,857 A | 10/2000 | Ogawa et al. | |
| 6,885,047 B2 * | 4/2005 | Shinohara et al. | 257/292 |
| 6,965,707 B1 * | 11/2005 | Kozlowski | 250/208.1 |
| 7,427,734 B2 * | 9/2008 | Yang et al. | 250/208.1 |
| 7,538,373 B2 * | 5/2009 | Ellis-Monaghan et al. | 257/292 |
| 7,750,281 B2 * | 7/2010 | Asaba et al. | 250/208.1 |
| 2002/0196352 A1 | 12/2002 | Boemler | |
| 2004/0036009 A1 | 2/2004 | Takayanagi et al. | |
| 2005/0185074 A1 * | 8/2005 | Yoneda et al. | 348/294 |

OTHER PUBLICATIONS

French Search Report dated Feb. 2, 2010 from corresponding French Application No. 09/56600.

* cited by examiner

*Primary Examiner* — Stephen W Smoot
*Assistant Examiner* — Sun M Kim
(74) *Attorney, Agent, or Firm* — Gardere Wynne Sewell LLP

(57) ABSTRACT

A pixel circuit of an image sensor includes a sense node for storing a charge transferred from one or more photodiodes, a source follower transistor having its gate coupled to the sense node and its source node coupled to an output line of the pixel circuit via a read transistor, wherein a body contact of the source follower transistor is connected to the output line.

31 Claims, 4 Drawing Sheets

IMAGE SENSOR PIXEL CIRCUIT

CROSS REFERENCE TO RELATED APPLICATIONS

This application claims the priority benefit of French patent application Ser. No. 09/56600, filed on Sep. 24, 2009, entitled "IMAGE SENSOR PIXEL CIRCUIT," which is hereby incorporated by reference to the maximum extent allowable by law.

FIELD OF THE INVENTION

The present invention relates to an image sensor, and in particular to the pixel circuit of an image sensor and method of manufacturing the same.

BACKGROUND TO THE INVENTION

Monolithic image sensors comprise photodiodes and transistors formed in a silicon substrate. More specifically, such image sensors comprise an array of pixels each having a photodiode coupled to a sense node via a transfer transistor. A voltage accumulated by the photodiode during an integration period can be transferred to the sense node via the transfer transistor.

FIG. 1 illustrates a pixel circuit 100 of an image sensor, comprising a photodiode 102, coupled via a transfer transistor 104 to a sense node 106. The sense node 106 has a capacitance 107, which is, for example, formed of parasitic capacitances of the surrounding components etc. The sense node 106 is coupled to a supply voltage VRT via a reset transistor 108, which receives a reset signal RST at its gate, and has its body contact connected to ground. The sense node 106 is also coupled to the gate of a source follower transistor 110, which has its drain coupled to the supply voltage VRT and its body contact (also sometimes referred to as the bulk contact) connected to ground. The source of the source follower transistor 110 is coupled, via a read transistor 112, to an output line 114 of the pixel circuit 100. The read transistor receives at its gate a read signal RD, and also has its body contact coupled to ground.

In order to improve the image quality of an image sensor comprising an array of the pixel circuits of FIG. 1, there is a need to improve the sensitivity of the pixel circuit.

SUMMARY OF THE INVENTION

It is one aim of embodiments of the present invention to at least partially address one or more needs in the prior art.

According to one aspect of the present invention, there is provided a pixel circuit of an image sensor comprising a sense node for storing a charge transferred from one or more photodiodes; a source follower transistor having its gate coupled to the sense node and its source coupled to an output line of the pixel circuit via a read transistor, wherein a body contact of the source follower transistor is connected to said output line.

According to one embodiment, the source follower transistor and the read transistor are formed in a same well, the body contact of the well being connected to the output line.

According to another embodiment, the well is surrounded by a shallow trench isolation, or a deep trench isolation.

According to another embodiment, the body contact of the well is formed adjacent to a source of the read transistor.

According to another embodiment, the image sensor further comprises a reset transistor coupled between the sense node and a supply voltage, and the gate of the reset transistor is arranged to receive a reset voltage and a body contact of the reset transistor is connected to said output line.

According to another embodiment, the reset transistor is formed in the same well as the source follower transistor and read transistor.

According to another embodiment, the sense node is coupled to the one or more photodiodes via one or more transfer transistors.

According to another embodiment, the image sensor comprises an array of the pixel circuits.

According to a further aspect of the present invention, there is provided an electronics device comprising the above image sensor.

According to yet a further aspect of the present invention, there is provided a method of manufacturing a pixel circuit of an image sensor comprising forming a source follower transistor having its gate coupled to a sense node and its source coupled to an output line of the pixel circuit via a read transistor; and forming a connection between a body contact of the source follower transistor and the output line.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

DETAILED DESCRIPTION

Figure 1:
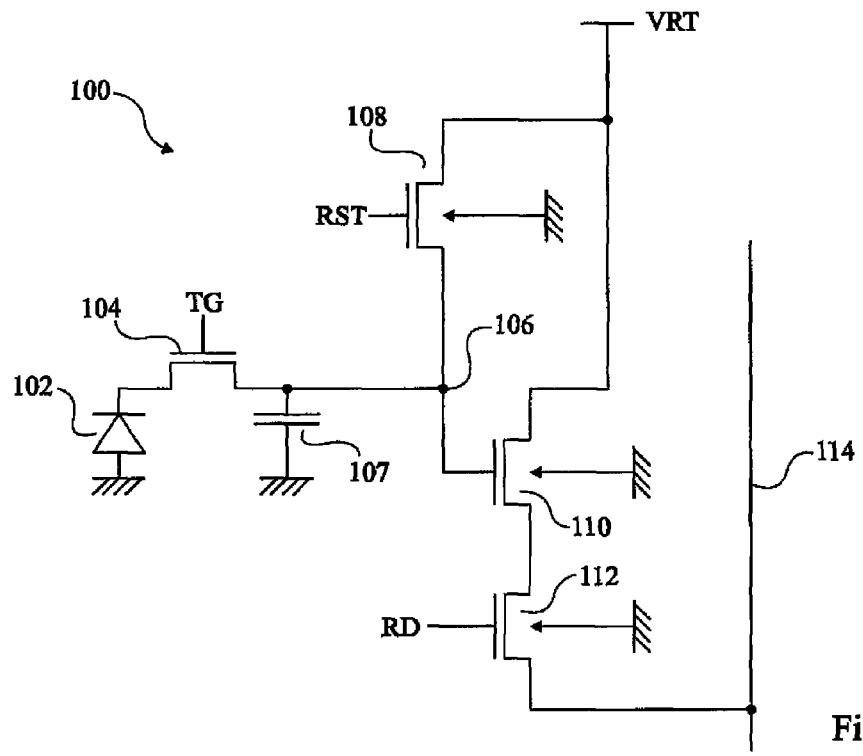
FIG. 1 (described above) illustrates schematically a pixel circuit.
Figure 2:
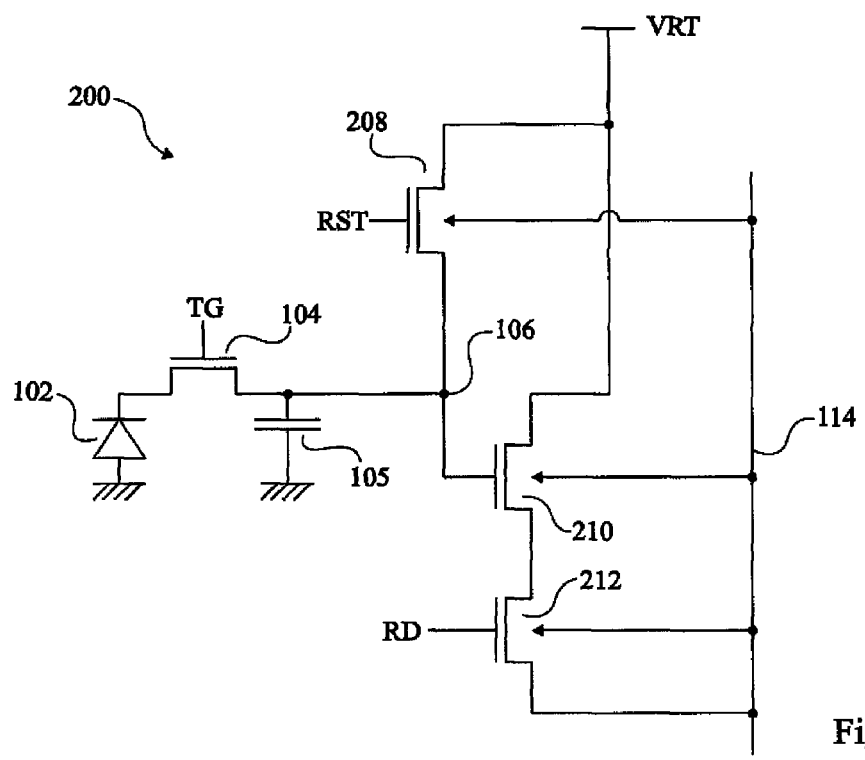
FIG. 2 illustrates schematically a pixel circuit according to an embodiment of the present invention.

FIG. 2 illustrates a pixel circuit 200, which has many parts in common with the pixel circuit 100 of FIG. 1, and like features have been labelled with like reference numerals. However, in pixel circuit 200, the reset transistor 108, source follower transistor 110, and read transistor 112 have been replaced by a reset transistor 208, source follower transistor 210 and read transistor 212 respectively. The source follower transistor 210, and optionally also the reset and read transistors 208, 212, have a body contact connected to the output column line 114. In particular, rather than having body contacts connected to ground, the body contact of at least the source follower transistor 210 is connected to the output line 114.

The inventors of the present application have found that the body effect of the source follower transistor limits its gain, and thus reduces the charge to column voltage conversion factor (CVF) of the source follower transistor. The gain A of the source follower transistor, equal to the change in voltage at its source divided by the change in voltage at its gate node, $\Delta V_S/\Delta V_G$, can be determined as follows:

$$A = \frac{1}{1 + \frac{\gamma}{2\sqrt{\phi_B - V_{BS}}}}$$

where $\gamma$ is equal to $((2q\epsilon_{si}N_A)^{1/2})/C_{ox}$, in which q is the elementary charge of the electron, $\epsilon_{si}$ is the relative permittivity of silicon, $N_A$ is the density of acceptors in the gate, $C_{ox}$ is the gate oxide capacitance per unit area, $\phi_B$ is the surface potential equal to $2(kT/q)\ln(NA/Ni)$, in which k is the Boltzmann constant, T is the temperature, $N_A$ is the density of acceptors in the gate, $N_i$ is the intrinsic carrier concentration, and $V_{BS}$ is the voltage difference between the body and the source.

To achieve a gain A that is close to unity, the voltage $V_{BS}$ should be low, preferably very close to zero, and be constant. The present inventors have found that this can be achieved by coupling the body to the output line of the pixel, as the output line provides a voltage level that closely follows the source voltage of the source follower transistor.

In alternative embodiments, the body contacts of the reset transistor 208 and/or read transistor 212 could be connected to a reference voltage such as ground, or to their respective source nodes.

Figure 3A:
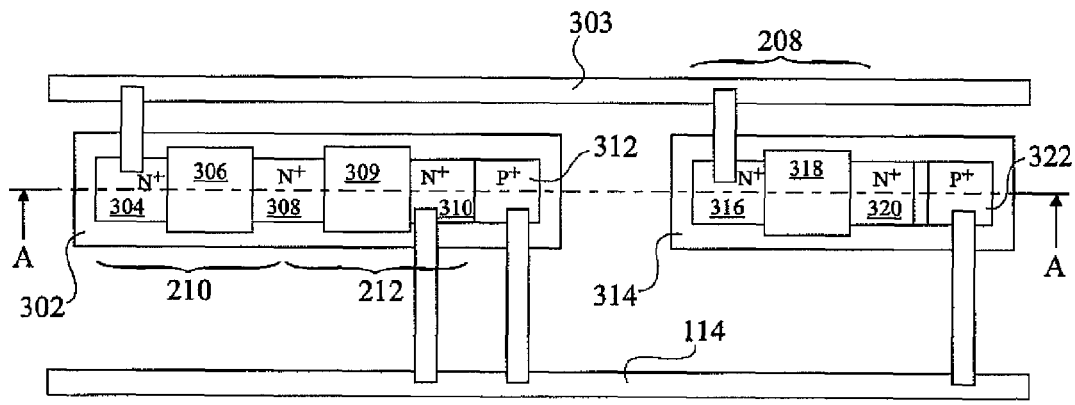
FIG. 3A illustrates, in plan view, the pixel circuit of FIG. 2 according to an embodiment of the present invention.

FIG. 3A is a plan view showing an example of the arrangement of the three transistors 210, 212 and 208 of FIG. 2. The source follower transistor 210 and read transistor 212 are formed in a same well, surrounded by a shallow trench isolation (STI) 302. The source follower transistor 210 comprises a drain, formed of a heavily doped N-type region 304 connected to a supply voltage rail 303, and a gate stack 306. The source of transistor 210 and drain of read transistor 212 are formed of a heavily doped N-type region 308. Read transistor 212 further comprises a gate stack 309, and a source formed of a heavily doped P-type region 310, which is connected to the output line 114. Within the well of the source follower transistor 210 and read transistor 212, a body contact 312 is formed of a heavily doped P-type region formed adjacent to the source 310. The body contact 312 is connected to the output line 114.

In a separate well surrounded by an STI 314, the reset transistor 208 is formed having a drain formed of a heavily doped N-type region 316 coupled to the supply voltage rail 303, a gate stack 318, and a source formed of a heavily doped N-type region 320. A body contact for the well of the reset transistor 208 is formed of a heavily doped P-type region 322, formed alongside the source region 320, but separated therefrom by a non-implanted zone.

Figure 3B:
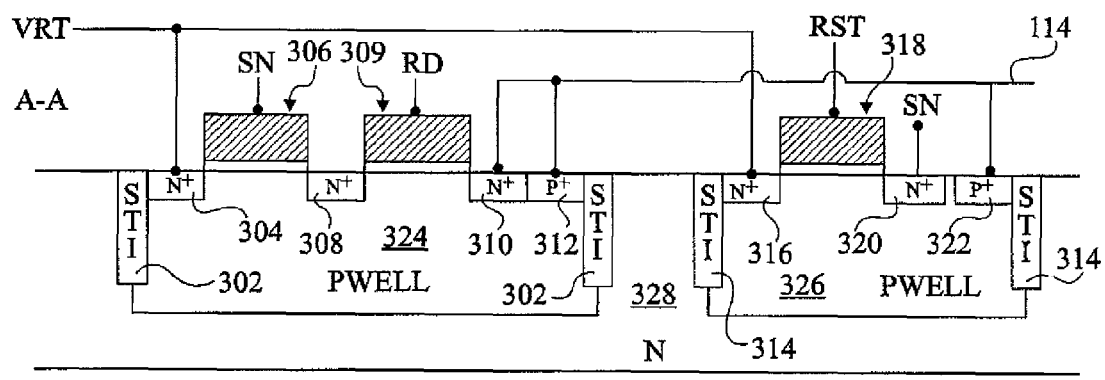
FIG. 3B illustrates a cross-section of the pixel circuit of FIG. 3A according to an embodiment of the present invention.

FIG. 3B illustrates a cross-section A-A of FIG. 3A, showing the STI trench 302 surrounding the P-well of transistors 210 and 212, labelled 324, and the STI trench 314 surrounding the P-well of the reset transistor 208, labelled 326. The P-wells 324 and 326 are formed in an N-type substrate 328. As shown, the source contact 310 and body contact 312 are for example formed adjacent to each other and in contact, as in any case these contacts are both connected to the same voltage on the output line.

Figure 3C:
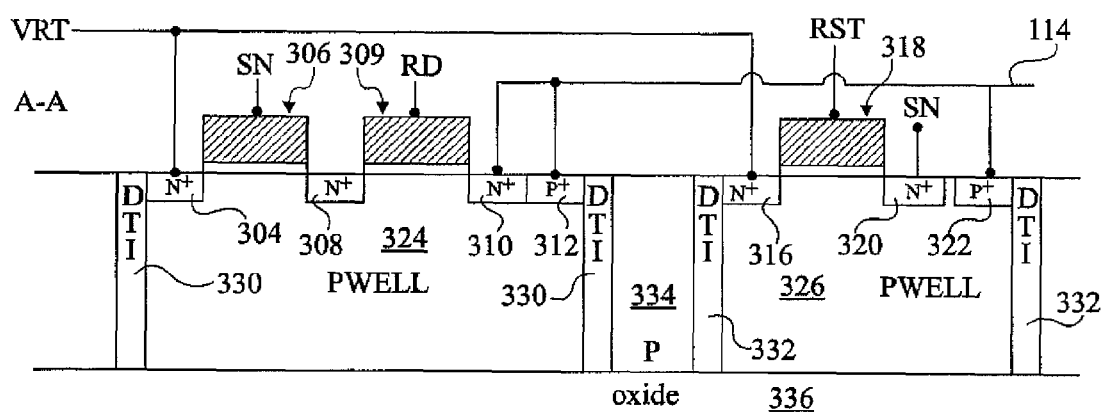
FIG. 3C illustrates a cross-section of the pixel circuit of FIG. 3A according to an alternative embodiment of the present invention.

FIG. 3C illustrates the cross-section A-A of FIG. 3A according to an alternative embodiment to that of FIG. 3B. In the cross-section of FIG. 3C, the shallow trench isolations 302, 314 are replaced by deep trench isolations (DTI) 330, 332, which extend the whole depth of P-wells 324, 326, which in this example are formed through the whole thickness of the P-type layer 334 formed over an underlying oxide insulation 336.

Figure 5:
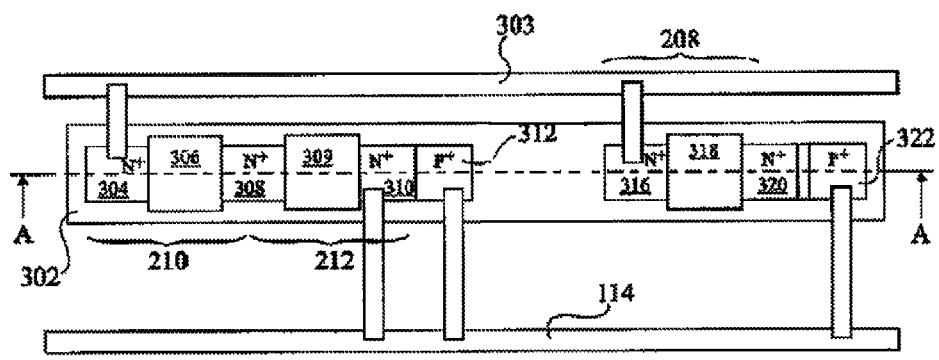
FIG. 5 illustrates the pixel circuit of FIG. 2 according to another embodiment.

In an alternative embodiment to that of FIGS. 3A, 3B and 3C, a single well could contain the three transistors 210, 212 and 208, and a single or multiple body contacts could be provided within this well for connecting it to the output line 114, as shown in FIG. 5.

Figure 4:
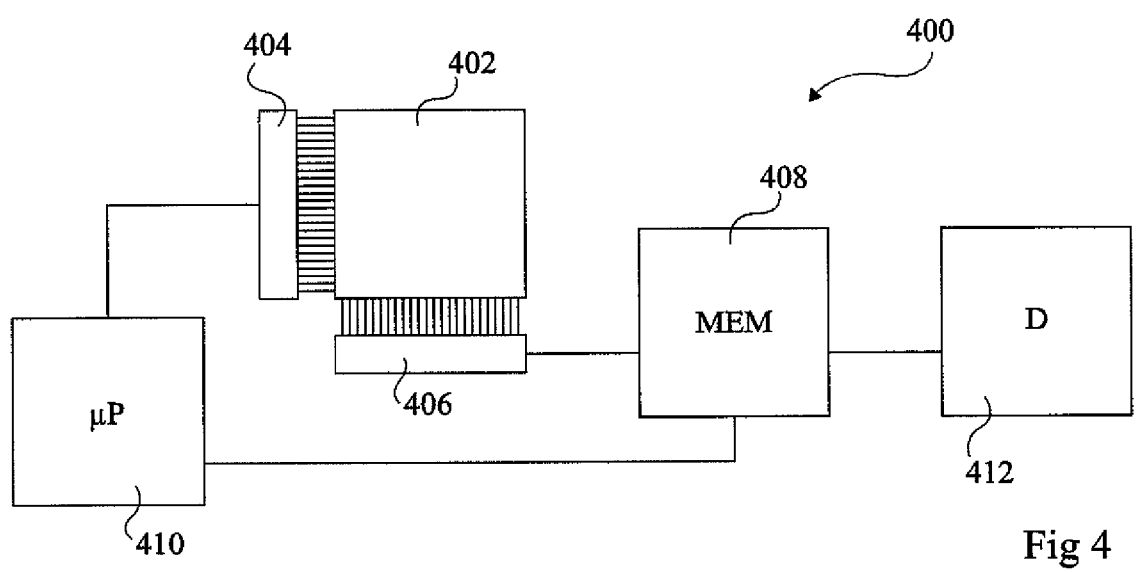
FIG. 4 illustrates schematically an electronics device according to an embodiment of the present invention.

FIG. 4 illustrates an electronic device 400 comprising an image sensor 402 including an array of pixels connected to pixel circuits each having a structure as described above in relation to the embodiments of FIG. 2, 3A, 3B or 3C. Control circuitry 404 provides control signals for the image sensor 402, in particular transfer voltages TG, reset voltages RST, and read voltages RD to the pixel circuits. Column circuitry 406 is provided for detecting and temporarily storing the output voltages from each pixel circuit, and storing the image data in a memory 408, under control of a micro-processor 410. A display 412 allows images stored in memory 408 to be displayed.

Electronic device 400 is for example a digital still and/or video camera, mobile device or portable games console having image capturing capabilities, a webcam, laptop computer or other digital image capturing device having an image sensor adapted to capture still images and/or video.

An advantage of coupling the body contact of the source follower transistor to the output line is that this enables a significant improvement in the charge to column voltage conversion factor, leading to a higher SNR, and thus improved sensitivity of the image sensor, and thus better image quality. For example, it has been found that a typical gain of the source follower transistor of approximately 0.75 can be increased by over 25 percent to gain that is very close to 1.

Furthermore, by coupling the body contact of both the source follower transistor and the read transistor to the output line, these transistors can advantageously be formed in a same well.

While the present invention has been described in relation to a number of specific embodiments, it will be apparent to those skilled in the art that various alterations and modifications could be applied.

For example, while the pixel circuit of FIG. 2 comprises a single photodiode, alternatively multiple photodiodes could be provided, each coupled to the sense node 106 via a corresponding transfer transistor. Furthermore, the invention could be applied to other pixel circuits in which a source follower transistor has its source coupled to an output line via a read transistor.

Furthermore, the embodiments described herein can apply to a wide range of image sensors, including image sensors with photodiodes and/or source follower transistors with junction isolation, DTI or STI isolation, or oxide isolation.

Furthermore, while the source follower, reset and read transistors are N-channel MOS transistors in the described embodiments, alternatively one or more of these transistors could be replaced by a P-channel MOS transistor.

Furthermore, while the source follower, reset and read transistors are N-channel MOS transistors in the described embodiments, alternatively one or more of these transistors could be replaced by a P-channel MOS transistor.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A pixel circuit of an image sensor comprising:
   a sense node for storing a charge transferred from one or more photodiodes; and
   a source follower transistor having a gate coupled to the sense node and its source coupled to an output line of the pixel circuit via a read transistor, wherein a body contact of the source follower transistor is directly electrically coupled to said output line.

2. The image sensor of claim 1, wherein said source follower transistor and said read transistor are formed in a same well, the body contact of said well being electrically coupled to said output line.

3. The image sensor of claim 2, wherein said well is surrounded by a shallow trench isolation.

4. The image sensor of claim 2, wherein said well is surrounded by a deep trench isolation.

5. The image sensor of claim 2, wherein the body contact of said well is formed adjacent to a source of said read transistor.

6. The image sensor of claim 2, further comprising a reset transistor coupled between the sense node and a supply voltage, wherein the gate of the reset transistor is arranged to receive a reset voltage and a body contact of the reset transistor is electrically coupled to said output line.

7. The image sensor of claim 6, wherein said reset transistor is formed in the same well as the source follower transistor and read transistor.

8. The image sensor of claim 1, wherein said sense node is coupled to the one or more photodiodes via one or more transfer transistors.

9. The image sensor of claim 1, comprising an array of said pixel circuits.

10. An electronics device comprising the image sensor of claim 1.

11. A method of manufacturing a pixel circuit of an image sensor comprising:
    forming a source follower transistor having its gate coupled to a sense node and its source coupled to an output line of the pixel circuit via a read transistor; and
    forming a direct electrical coupling between a body contact of the source follower transistor and the output line.

12. The method of claim 11, further comprising:
    forming the source follower transistor and the read transistor in a same first well; and
    forming an electrical coupling between a body contact of the first well and the output line.

13. The method of claim 12, further comprising forming a shallow trench isolation structure around the first well.

14. The method of claim 12, further comprising forming a deep trench isolation structure around the first well, wherein the deep trench isolation structure extends to an underlying insulating layer below the first well.

15. The method of claim 12, further comprising forming the body contact of the first well adjacent to a source of the read transistor.

16. The method of claim 12, further comprising forming a reset transistor coupled between the sense node and a supply voltage, wherein a gate of the reset transistor is arranged to receive a reset voltage and a body contact of the reset transistor is electrically coupled to the output line.

17. The method of claim 16, further comprising forming the reset transistor in the same first well.

18. The method of claim 16, further comprising forming the reset transistor in a second well that is separated from the first well by at least one trench isolation structure.

19. The method of claim 18, further comprising forming an electrical coupling between a body contact of the first well and a body contact of the second well and the output line.

20. The method of claim 11, further comprising forming a coupling between the sense node and one or more photosensors.

21. The method of claim 20, further comprising forming one or more transfer transistors as part of the coupling between the sense node and the one or more photosensors.

22. The method of claim 11, further comprising forming an array of the pixel circuits arranged for two-dimensional imaging.

23. A sensor circuit comprising:
    a sense node for storing a charge; and
    a source follower transistor having a gate coupled to the sense node and its source coupled to an output line of the sensor circuit via a read transistor, wherein a first body contact of the source follower transistor is directly electrically coupled to the output line.

24. The sensor circuit of claim 23, further comprising a photosensor coupled to the sense node for producing the charge that is stored at the sense node.

25. The sensor circuit of claim 23, further comprising:
    a first well of a first conductivity type formed in a substrate, wherein the source follower transistor and the read transistor are formed in the first well; and
    a first trench isolation structure surrounding the first well.

26. The sensor circuit of claim 25, further comprising a first body contact formed in the first well that is electrically coupled to the output line.

27. The sensor circuit of claim 26, wherein the first body contact is formed adjacent to a source of the read transistor.

28. The sensor circuit of claim 26, further comprising:
    a second well of the first conductivity type formed in the substrate and surrounded by a second trench isolation structure; and
    a reset transistor formed in the second well, wherein the reset transistor is configured to reset a potential at the sense node.

29. The sensor circuit of claim 28, further comprising a second body contact in the second well that is electrically coupled to the first body contact.

30. A plurality of sensor circuits as claimed in claim 23 disposed in an array.

31. The sensor circuits of claim 30, wherein the array is configured to detect two-dimensional images.

\* \* \* \* \*